US012166250B2

(12) United States Patent
McClory et al.

(10) Patent No.: US 12,166,250 B2
(45) Date of Patent: Dec. 10, 2024

(54) SYSTEM AND METHOD FOR INDIRECTLY MONITORING AN ISOLATION RESISTANCE OF ONE OR MORE FUEL CELLS

(71) Applicant: Toyota Motor Engineering & Manufacturing North America, Inc., Plano, TX (US)

(72) Inventors: Matthew K. McClory, Aliso Viejo, CA (US); Daniel Charles Folick, Long Beach, CA (US); Dakota Kelley, Garland, TX (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 184 days.

(21) Appl. No.: 17/563,674

(22) Filed: Dec. 28, 2021

(65) Prior Publication Data

US 2023/0207846 A1 Jun. 29, 2023

(51) Int. Cl.
*H01M 8/04858* (2016.01)
*G01R 31/389* (2019.01)
(Continued)

(52) U.S. Cl.
CPC ...... *H01M 8/04952* (2016.02); *G01R 31/389* (2019.01); *G01R 31/52* (2020.01);
(Continued)

(58) Field of Classification Search
CPC ... H01M 8/04–04014; H01M 8/04029; H01M 8/04044; H01M 8/04067–04074;
(Continued)

(56) References Cited

U.S. PATENT DOCUMENTS 8,570,047 B1\* 10/2013 Davies .................. H02J 7/0019
324/426
9,068,922 B2 6/2015 Foley
(Continued)

FOREIGN PATENT DOCUMENTS

JP H06118111 A 11/1994
WO 2013037031 A1 3/2013

OTHER PUBLICATIONS

Bozzolo, M. et al., "Moving Toward Climate Neutrality—Fuel Cell Technology for Future Energy and Propulsion Systems", MTU Solutions, Nov. 18, 2020.
(Continued)

*Primary Examiner* — Jonathan Crepeau
*Assistant Examiner* — Jacob Buchanan
(74) *Attorney, Agent, or Firm* — Christopher G. Darrow; Darrow Mustafa PC

(57) ABSTRACT

Systems and methods for monitoring the isolation resistance of one or more fuel cells are described herein. In one example, a system includes a current transformer having a hollow core. First and second portions of a load line from a fuel cell are located within the hollow core. The first portion of the load line is electrically between an anode of a fuel cell and an electrical load, while the second portion of the load line being electrically between a cathode of the fuel cell and the electrical load. The current transformer is configured to output an electrical signal proportional to a current passing through the hollow core. This electrical signal can then be used to determine the isolation resistance of the fuel cell.

10 Claims, 4 Drawing Sheets

(51) Int. Cl.
*G01R 31/52* (2020.01)
*H01M 8/04537* (2016.01)
*H01M 8/04992* (2016.01)

(52) U.S. Cl.
CPC ... *H01M 8/04589* (2013.01); *H01M 8/04649* (2013.01); *H01M 8/04656* (2013.01); *H01M 8/0491* (2013.01); *H01M 8/04992* (2013.01)

(58) Field of Classification Search
CPC ......... H01M 8/04313; H01M 8/04537–04597; H01M 8/04634–04656; H01M 8/04664; H01M 8/04686; H01M 8/04746–04776; H01M 8/04858–04917; H01M 8/04949–04953; B60L 3/00; B60L 3/0053; B60L 3/0069; B60L 50/50–53; B60L 50/70–75; B60L 58/30–40; G01R 31/005–007; G01R 31/50–52
See application file for complete search history.

(56) References Cited

U.S. PATENT DOCUMENTS

| | | | | |
|---|---|---|---|---|
| 2002/0164511 | A1* | 11/2002 | Uozumi | H01M 8/04029 429/429 |
| 2004/0170877 | A1* | 9/2004 | Wakabayashi | C02F 1/42 429/410 |
| 2007/0013382 | A1* | 1/2007 | Hinz | B60L 3/0053 429/9 |
| 2008/0224687 | A1* | 9/2008 | Breese | H01M 8/04634 324/76.11 |
| 2011/0291488 | A1* | 12/2011 | Paik | G01R 15/183 307/104 |
| 2012/0326516 | A1 | 12/2012 | Gurunathan et al. | |
| 2016/0141863 | A1* | 5/2016 | Kim | H01M 16/006 429/429 |
| 2016/0141864 | A1 | 5/2016 | Mikajiri | |
| 2019/0079129 | A1* | 3/2019 | Valdes | H02H 3/165 |
| 2019/0293724 | A1 | 9/2019 | Muller et al. | |
| 2021/0033645 | A1* | 2/2021 | Kim | H01M 8/04686 |

OTHER PUBLICATIONS

Bender GmbH & Co. Kg. "Linetraxx RCMS460-D." Accessed at https://www.bender.de/en/products/residual-current-monitoring/linetraxx_rcms460-d on Dec. 29, 2021.

Bender GmbH & Co. Kg. "Linetraxx CTUB100 series." Accessed at https://www.bender.de/en/products/current-transformers/linetraxx_ctub100-series on Dec. 29, 2021.

European Search Report for International Application EP22213968, mailed on Jun. 6, 2023 (7 pages).

* cited by examiner

SYSTEM AND METHOD FOR INDIRECTLY MONITORING AN ISOLATION RESISTANCE OF ONE OR MORE FUEL CELLS

TECHNICAL FIELD

The subject matter described herein relates, in general, to systems and methods for monitoring an isolation resistance of a fuel cell.

BACKGROUND

The background description provided is to present the context of the disclosure generally. Work of the inventor, to the extent it may be described in this background section, and aspects of the description that may not otherwise qualify as prior art at the time of filing, are neither expressly nor impliedly admitted as prior art against the present technology.

Fuel cells are electrochemical cell that converts the chemical energy of a fuel and an oxidizing agent into electricity through a pair of redox reaction. Fuel cells generally include an anode, a cathode, and an electrolyte that allows ions, often positively charged hydrogen ions, to move between the two sides of the fuel cell. At the anode, a catalyst causes the fuel to undergo oxidation reactions that generate ions and electrons. The ions move from the anode to the cathode through the electrolyte. At the same time, electrons flow from the anode to the cathode through an external circuit, producing direct current electricity. Another catalyst causes ions, electrons, and oxygen to react at the cathode, forming water and possibly other products.

Some fuel cells require the use of coolant to properly cool the fuel cell. The coolant passes through the fuel cell and is then provided to a heat exchanger. However, during this process, corrosion from the fuel cell and other pollutants may accumulate within the coolant. This accumulation increases the conductivity of the coolant, which may result in short-circuiting, induce galvanic corrosion, and electrolyze the coolant, reducing efficiency and possibly posing a safety hazard. Fuel cell coolant systems may employ ion exchangers that effectively filter out ions from the current to prevent these drawbacks from occurring.

However, the ion exchangers must be routinely serviced to operate properly. Currently, maintenance schedules are time-based, wherein one or more parts of the ion exchanger are replaced after a period of time—either operational or static—has expired. This results in situations where the ion exchanger may be serviced unnecessarily, resulting in unnecessary maintenance costs. More concerning are situations where the ion exchanger requires service but will not be serviced based on a maintenance schedule. In these situations, significant damage to the fuel cell may or safety issues may arise.

SUMMARY

This section generally summarizes the disclosure and does not comprehensively explain its full scope or all its features.

In one embodiment, a system includes a current transformer having a hollow core. First and second portions of a load line from a fuel cell are located within the hollow core. The first portion of the load line is electrically between an anode of a fuel cell and an electrical load, while the second portion of the load line being electrically between a cathode of the fuel cell and the electrical load. The current transformer is configured to output an electrical signal proportional to a current passing through the hollow core. This electrical signal can then be used to determine the isolation resistance of the fuel cell and/or when the ion exchanger should be changed or otherwise serviced.

The system can also be used to determine an overall isolation resistance of a plurality of fuel cells and/or when the ion exchangers of the plurality of fuel cells should be changed or otherwise serviced. Here, like before, the system includes a current transformer having a hollow core. The first and second portions of a plurality of load lines from the plurality of fuel cells are located within the hollow core. The first portions of the load lines are electrically between anodes of a plurality of fuel cells and at least one electrical load, while the second portions of the load lines are electrically between cathodes of the fuel cell and the at least one electrical load. The current transformer is configured to output an electrical signal proportional to a current passing through the hollow core. This electrical signal can then be used to determine an overall isolation resistance of a plurality of fuel cells and/or when the ion exchangers of the plurality of fuel cells should be changed or otherwise serviced.

In another embodiment, a method includes the steps of receiving an electrical signal from a current transformer having a hollow core and determining an isolation resistance of the fuel cell based on the electrical signal outputted by the current transformer. Like before, first and second portions of a load line from the fuel cell are located within the hollow core. The first portion of the load line is electrically between an anode of a fuel cell and an electrical load, while the second portion of the load line being electrically between a cathode of the fuel cell and the electrical load. The current transformer is configured to output an electrical signal proportional to a different current passing through the hollow core used by the method to determine the isolation resistance of the fuel cell.

As an alternative, the method can also determine an overall isolation resistance of a plurality of fuel cells and/or when the ion exchangers of the plurality of fuel cells should be changed or otherwise serviced. In that situation, first and second portions of a plurality of load lines from the plurality of fuel cells are located within the hollow core.

Further areas of applicability and various methods of enhancing the disclosed technology will become apparent from the description provided. The description and specific examples in this summary are intended for illustration only and do not limit the scope of the present disclosure.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements, or multiple elements may be designed as one element. In some embodiments, an element shown as an internal component of another element may be implemented as an external component and vice versa. Furthermore, elements may not be drawn to scale.

DETAILED DESCRIPTION

Figure 1:
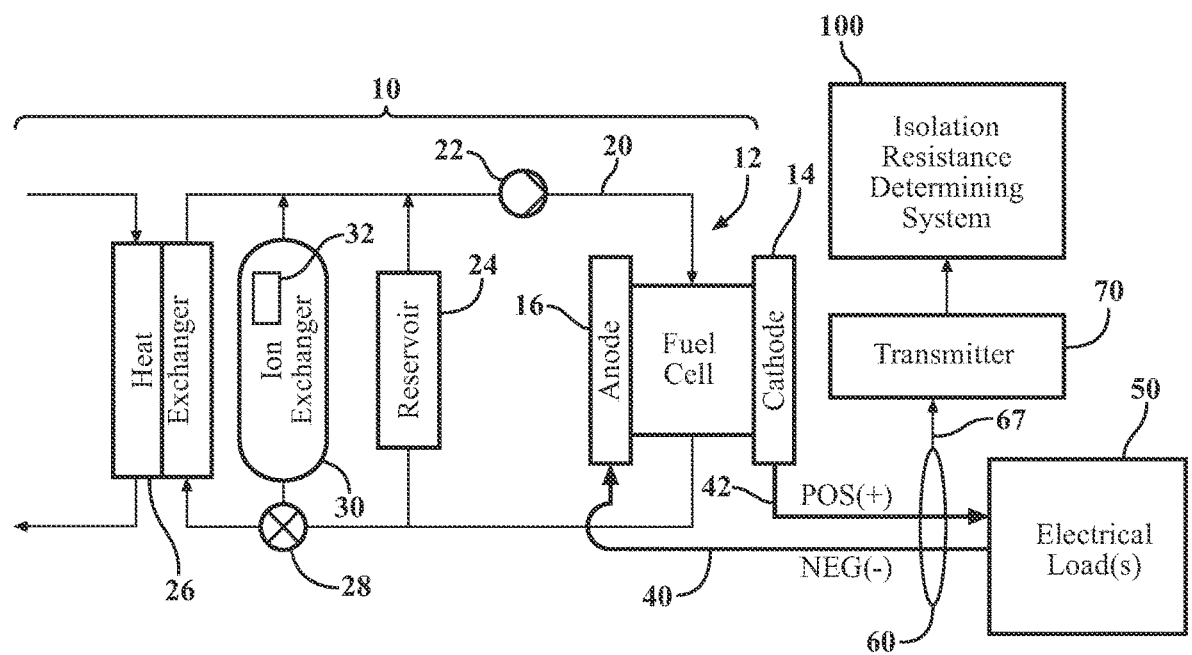
FIG. 1 illustrates one example of a fuel cell system having a fuel cell and an isolation resistance determining system used to determine the isolation resistance of the fuel cell.

Described are systems and methods for indirectly determining the isolation resistance of one or more fuel cells. Generally, the isolation resistance of a fuel cell measures the electrical resistance between points within the coolant loop of a fuel cell. A change in the measured resistance can be associated with a deterioration of the coolant. Essentially, over time, corrosion from the fuel cell and other pollutants may accumulate within the coolant. This accumulation increases the conductivity of the coolant, which may result in short-circuiting, induce galvanic corrosion, and electrolyze the coolant, reducing efficiency.

The systems and methods described can indirectly determine the isolation resistance of one or more fuel cells through the use of a current transformer. As will be described later in this specification, a current transformer produces an electrical signal that is representative of a current passing through a hollow core along a primary conductor. Electrical lines from the anode and cathode of the fuel cell to an electrical load pass through the hollow core of the current transformer, such that the current transformer essentially measures the current passing through these electrical lines. Since the electrical lines are between the fuel cell and the electrical load, with the only difference being that one of the electrical lines is connected to the anode of the fuel cell, while the other electrical line is connected to the cathode of the fuel cell, the current measured by the current transformer should be close to zero.

As the coolant becomes more conductive, the fuel cell will become less efficient, resulting in a situation where the current in the electrical line between the cathode of the fuel cell and the electrical load will be greater than the current in the electrical line between the electrical load in the anode of the fuel cell. When this occurs, the current transformer will output an electrical signal indicating a current measurement greater than zero, indicating the isolation resistance of the fuel cell. When the measurement from the current transformer surpasses a threshold, the system and method may then determine that an ion exchanger should be serviced.

As explained in the background section, service or other maintenance of ion exchangers typically occurs based on a service schedule. By determining when the ion exchanger should be serviced based on the indirect measurement of the isolation resistance by the system and method, the ion exchanger can be serviced when the fuel cell actually needs service, as opposed to a service schedule that may result in unnecessary service.

In other situations, the ion exchanger is operating acceptably but the amount of coolant actually circulating through the ion exchanger cannot keep up with the rate that the overall coolant loop is ionizing. In these situations, this information can be utilized to perform a deliberate de-ionization. As such, the isolation resistance measurement can be used as a feedback loop to perform testing, whereby a controller automatically runs the fuel cell in a predetermined maintenance operation specifically designed to force extra coolant through the ion exchanger at a higher flowrate to deionize the system.

FIG. 1 illustrates one example of a fuel cell system 10 that utilizes an isolation resistance determining system 100. The fuel cell system 10 may include a fuel cell 12 having a cathode 14 and an anode 16. The fuel cell 12 is an electrochemical cell that converts the chemical energy of a fuel, such as hydrogen, and an oxidizing agent, such as oxygen, into electricity through a pair of redox reactions.

During the operation of the fuel cell 12, an electrolyte allows ions to move between the two sides of the fuel cell 12. At the anode 16, a catalyst causes the fuel to undergo oxidation reactions that generate ions and electrons. The ions move from the anode 16 to the cathode 14 through the electrolyte. At the same time, electrons flow from the anode 16 to the cathode 14 through one or more electrical load(s) 50, producing direct current electricity. At the cathode 14, another catalyst causes ions, electrons, and oxygen to react, forming water and possibly other products.

The electrical load(s) 50 can be any type of electrical device or devices. In one example, the electrical load(s) 50 could be one or more batteries utilized to store electricity generated by the fuel cell 12 that will later be utilized in one or more applications. In other examples, the electrical load(s) 50 could be one or more inverters that convert the direct current from the fuel cell 12 into alternating current that may provide power to a building. Again, the electrical load(s) 50 can vary significantly from application to application and should not be limited to the abovementioned examples.

The fuel cell 12 may require cooling that is provided by a coolant loop 20. The coolant utilized in the coolant loop can be any one of a number of different coolants, such as deionized water or a mixture of ethylene glycol and deionized water. The coolant is provided to the fuel cell 12 by a pump 22. After the coolant passes through the fuel cell 12, it is provided to a heat exchanger 26 that will transfer heat within the coolant to another system. Also illustrated within the coolant loop 20 is a reservoir 24 that holds excess coolant and allows air or other gases within the coolant loop 20 to accumulate and be replaced by coolant as it circulates throughout the coolant loop 20.

The coolant loop 20 also includes a valve 28 that directs a portion of the coolant through an ion exchanger 30. The ion exchanger 30 may include ion exchanger components 32 that can include one or more filters or other components, such as cartridges that may require routine replacement. The ion exchanger 30 may remove metal ions from the coolant by adsorbing the metal ions on an ion exchange resin. Effectively, the ion exchanger 30 may remove ions from the coolant to reduce the conductivity of the coolant. As explained previously, corrosion from the fuel cell and other pollutants may accumulate within the coolant, increasing the conductivity of the coolant. As a coolant increases in conductivity, the efficiency of the fuel cell 12 decreases. As such, the ion exchanger 30 may need to be serviced routinely to function properly such that ions are removed from the coolant.

However, instead of performing maintenance on the ion exchanger 32, there may be situations where the ion exchanger 32 is operating acceptably but the amount of coolant actually circulating through the ion exchanger 32 cannot keep up with the rate that the overall coolant loop is ionizing. In these situations, this information can be utilized to perform a deliberate de-ionization. As such, the isolation resistance measurement can be used as a feedback loop to perform testing, whereby the controller automatically runs the fuel cell in a predetermined maintenance operation specifically designed to force extra coolant through the ion exchanger at a higher flowrate (by manipulating water pump and 3-way control valve) to deionize the system.

As explained previously, the fuel cell 12 provides power to the electrical load(s) 50. More specifically, the current generated by the fuel cell 12 is provided from the cathode 14 of the fuel cell to the electrical load(s) 50 via an electrical line 40. As this current passes through the electrical load(s) 50, it is then sent to the anode 16 of the fuel cell 12 via an electrical line 42. Here, a current transformer 60 is placed such the electrical lines 40 and 42 passed through a hollow core of the current transformer 60. As will be explained later in this description, the current transformer 60 outputs an electrical signal 67 that will be provided to the isolation resistance determining system 100 by a transmitter 70. Again, as will be explained later in this description, electrical signal 67 will then be utilized to indirectly determine the isolation resistance of the fuel cell 12, which indicates when the ion exchanger 30 needs servicing.

Figure 2:
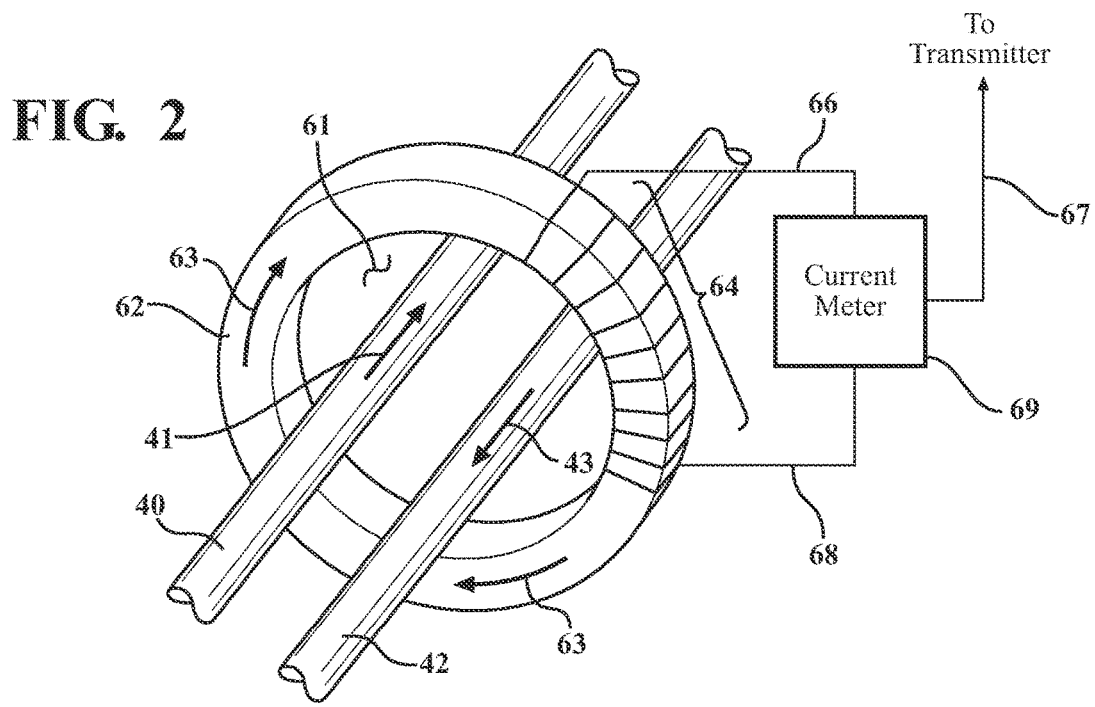
FIG. 2 illustrates one example of a current transformer utilized by the isolation resistance determining system.

Referring to FIG. 2, illustrated is one example of the current transformer 60 that may be utilized by the isolation resistance determining system 100 of FIG. 1. In this example, the current transformer 60 includes a hollow core 62. The hollow core 62, in this example, is a ring-shaped hollow core defines a hole 61 that allows one or more primary conductors to pass through. The hollow core 62 may be made of any suitable material, such as iron or silicon steel.

Wrapped around a portion of the hollow core 62 is a secondary winding 64. As current passes through a primary conductor that extends through the hole 61 or the hollow core 62, an electrical field is generated and a magnetic flux is concentrated in the hollow core 62, which produces Eddy currents 63, which are transmitted to the secondary winding 64. The secondary winding 64 has terminal ends 66 and 68 connected to a current meter 69, which then outputs an electrical signal 67 based on the current passing through the secondary winding 64.

As stated previously, the current transformer 60 can measure the current passing through a primary conductor. In this example, the primary conductor is two primary conductors. The first primary conductor is the electrical line 40, while the second primary conductor is the electrical line 42. As previously explained, the electrical line 40 carries a current 41 from the cathode 14 of the fuel cell 12 to an electrical load(s) 50. The electrical line 42 is an electrical line carrying a current 43 from the electrical load(s) 50 to the anode 16 of the fuel cell 12.

The electrical signal 67 produced by the current meter 69 represents the differential current between the currents 41 and 43 carried by the electrical lines 40 and 42, respectively. As mentioned before, generally, one would expect that the current 41 in the current 43 generally be equal to each other. This would result in a situation wherein the electrical signal 67 output by the current meter 69 would be approximately zero. However, as the isolation resistance of the fuel cell system 10 of FIG. 1 changes due to the increased conductivity of the coolant within the coolant loop 20, this differential current should grow. As such, the electrical signal 67 that indicates the differential current between the currents 41 and 43 can be used to indirectly determine the isolation resistance of the fuel cell 12.

Brief mention is made regarding the current meter 69 and the electrical signal 67 output by the current meter 69. The electrical signal 67 output by the current meter 69 may be an analog or digital signal indicating the current differential between the currents 41 and 43. The electrical signal 67 can then be provided to the isolation resistance determining system 100 of FIG. 1 directly or via a transmitter 70. In some cases, the transmitter 70 may be such that it can transmit a signal based on the electrical signal 67 using a wired or wireless communication protocol to the isolation resistance determining system 100.

It is noted that FIGS. 1 and 2 illustrate a situation where only two electrical lines 40 and 42 are passing through the hole 61 of the hollow core 62 of the current transformer 60. In these situations, the isolation resistance of a single fuel cell, such as the fuel cell 12 can be indirectly measured. However, it may be advantageous to place multiple pairs of electrical lines through the hole 61 of the hollow core 62 of the current transformer 60 to generate an overall indirect measurement of the isolation resistance of multiple fuel cells. In some situations, multiple fuel cells may utilize the same coolant loop and may be subject to similar issues wherein the coolant within the coolant loop becomes more conductive over time.

Figure 3:
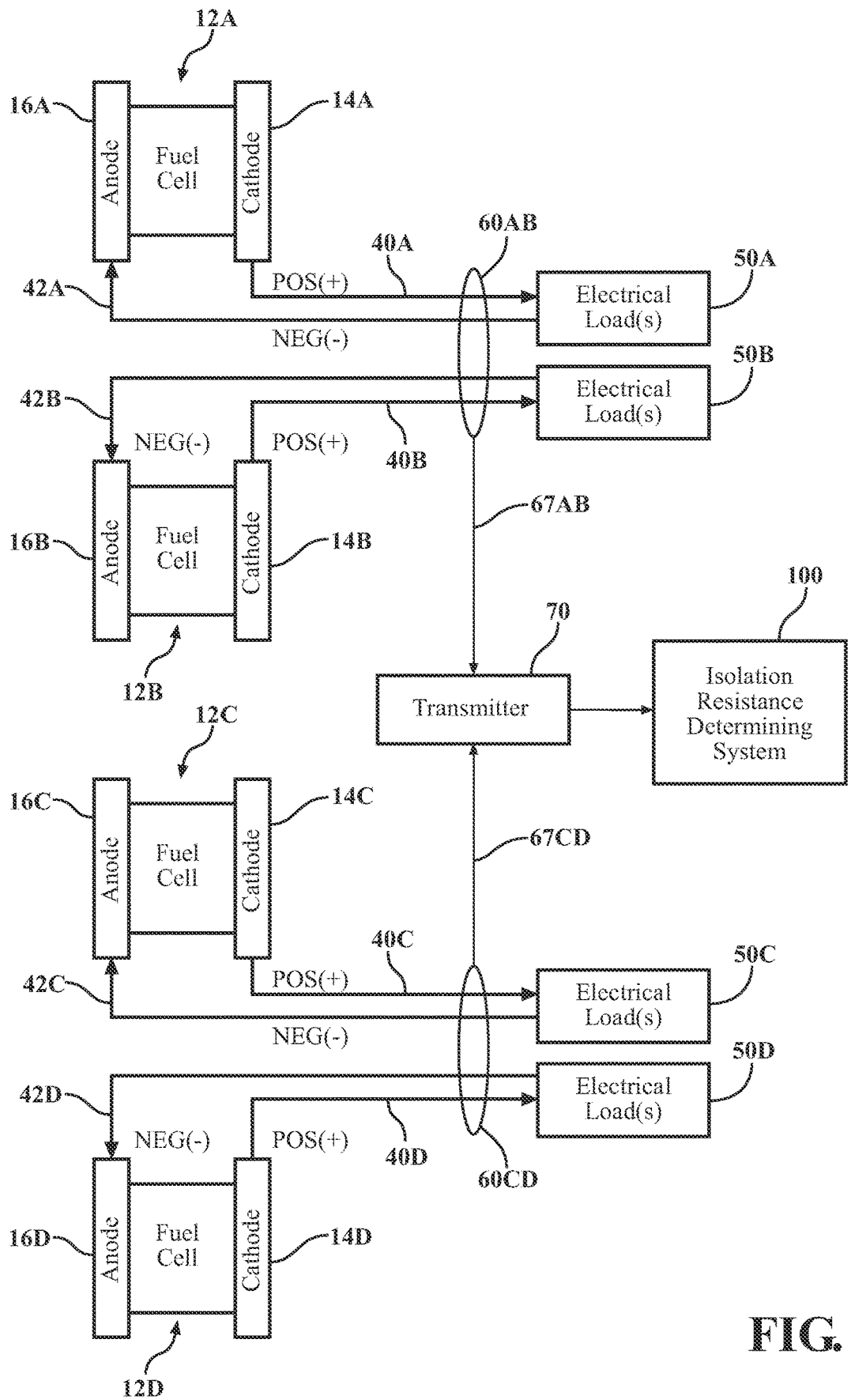
FIG. 3 illustrates a plurality of fuel cells and an isolation resistance determining system used to determine the overall isolation resistance of the plurality of fuel cells.

As such, referring to FIG. 3 illustrated is an example of multiple fuel cells 12A-12D each having electrical lines 40A-40D that extend from cathodes 14A-14D to electrical load(s) 50A-50D and electrical lines 42A-42D that extend from anodes 16A-16D to electrical load(s) 50A-50D. Here, like reference numerals have been utilized to refer to like elements and any previous description regarding those elements is equally applicable.

In this example, the current transformer 60AB has the electrical lines 40A-40B and 42A-42B extending through its hollow core. Similarly, the current transformer 60CD has the electrical lines 40C-40D and 42C-42D extending through its hollow core. As such, the current transformer 60AB measures the differential current between the electrical lines 40A-40B and 42A-42B, while the current transformer 60CD measures the differential current between the electrical lines 40C-40D and 42C-42D. The current transformers 60AB and 60CD then output to the isolation resistance determining system 100, either directly or via the transmitter 70, electrical signals 67AB and 67CD representative of the differential currents measured by current transformers 60AB and 60CD, respectively.

The example shown in FIG. 3 can be advantageous because it does not necessarily require as many current transformers. In this example, the overall isolation resistance of two fuel cells can be indirectly determined using a single current transformer. However, instead of two fuel cells, the overall isolation resistance of any number of fuel cells could be determined utilizing a single current transformer.

Figure 4:
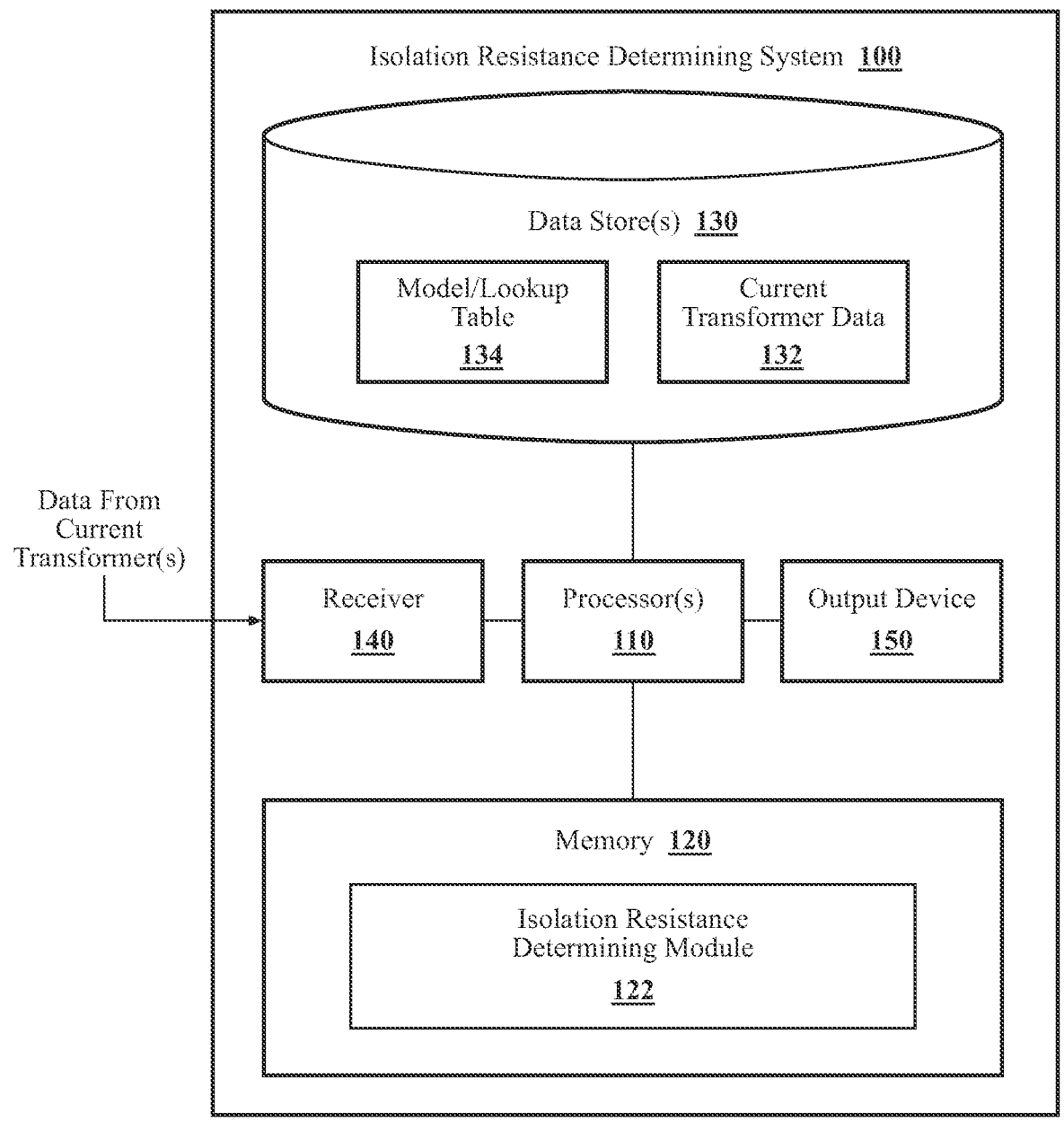
FIG. 4 illustrates a more detailed view of the isolation resistance determining system.

Turning our attention to FIG. 4, illustrated is a more detailed view of the isolation resistance determining system 100, which may be in the form of a programmable logic controller. As shown, isolation resistance determining system 100 includes one or more processor(s) 110. Accordingly, the processor(s) 110 may be a part of the isolation resistance determining system 100 or the isolation resistance determining system 100 may access the processor(s) 110 through a data bus or another communication path. In one or more embodiments, the processor(s) 110 is an application-specific integrated circuit that is configured to implement functions associated with an isolation resistance determining module 122. In general, the processor(s) 110 is an electronic processor such as a microprocessor that is capable of performing various functions as described herein.

In one embodiment, the isolation resistance determining system 100 includes a memory 120 that stores isolation resistance determining module 122. The memory 120 may be a random-access memory (RAM), read-only memory (ROM), a hard disk drive, a flash memory, or other suitable memory for storing the isolation resistance determining module 122. The isolation resistance determining module 122 is, for example, computer-readable instructions that, when executed by the processor(s) 110, cause the processor(s) 110 to perform the various functions disclosed herein.

Furthermore, in one embodiment, the isolation resistance determining system 100 includes one or more data store(s) 130. The data store(s) 130 is, in one embodiment, an electronic data structure such as a database that is stored in the memory 120 or another memory and that is configured with routines that can be executed by the processor(s) 110 for analyzing stored data, providing stored data, organizing stored data, and so on. Thus, in one embodiment, the data store(s) 130 stores data used by the isolation resistance determining module 122 in executing various functions.

In this example, the data store(s) 130 may store the current transformer data 132 that may be data provided to the isolation resistance determining system 100 by the current transformer 60 in the form of an electrical signal 67. As stated before, the electrical signal 67 contains the data from the current transformer 60 may be provided directly to the isolation resistance determining system 100 or indirectly via the transmitter 70. The current transformer data 132 may be data indicating the current differential measured by the current transformer 60.

The data store(s) 130 may also include one or more models or lookup tables 134. As stated previously, the current transformer 60 determines the differential current of the currents 41 and 43 transmitted by the electrical lines 40 and 42, respectively, and may be stored as the current transformer data 132. However, to interpret the current transformer data 132, the models and/or lookup tables 134 may be utilized by the processor(s) 110 to determine the isolation resistance and/or when the ion exchanger 30 should be serviced.

In situations where lookup tables are utilized, values of the differential current stored in the current transformer data 132 may be cross-referenced with a value that indicates the isolation resistance and/or when the ion exchanger 30 should be serviced. In situations where models are utilized, one or more equations, neural networks, or other methodologies may be utilized to convert the current transformer data 132 into one or more values indicating the isolation resistance and/or when the ion exchanger 30 should be serviced.

The isolation resistance determining system 100 may also include a receiver 140 that is in communication with the processor(s) 110 for receiving information from the transmitter 70 or even directly from the current transformer 60. In one example, the receiver 140 may be a wired or wireless receiver that can receive signals and convert these signals to data that can be stored as the current transformer data 132.

The isolation resistance determining system 100 may also include an output device 150 that is in communication with the processor(s) 110. The output device 150 can be any output device that can provide information to an operator or another system regarding the isolation resistance determined by the isolation resistance determining system 100 and/or an indication when the ion exchanger 30 should be serviced. As such, the output device 150 could be a display device, audible device, haptic feedback device, or an electrical output to another system.

As to the isolation resistance determining module 122, the isolation resistance determining module 122 includes instructions that cause the processor(s) to perform any one of a number of different methodologies disclosed in this specification. In one example, the isolation resistance determining module 122 includes instructions that, when executed by the processor(s) 110, cause the processors(s) 110 to receive information from the current transformer 60 directly or indirectly by the transmitter 70 the receiver 140. As stated previously, the electrical signal 67 generated by the current transformer may be in the form of an analog or digital signal that can then be converted to data stored as the current transformer data 132.

The isolation resistance determining module 122 may also include instructions that, when executed by the processor(s) 110, cause the processors(s) 110 to determine an isolation resistance of the plurality of fuel cells based on the electrical signal outputted by the current transformer 60 and/otherwise stored as the current transformer data 132. As stated previously, the current transformer data 132 and/or the electrical signal 67 essentially represents the current differential of the current transmitted by the electrical lines that pass through the hollow core 62. Here, the isolation resistance determining module 122 may cause the processor(s) 110 to utilize the models or lookup tables 134 to convert the current differential measured by the current transformer 60 into an indirect measurement regarding the isolation resistance of the fuel cell 12.

The isolation resistance determining module 122 may also include instructions that, when executed by the processor(s) 110, cause the processors(s) 110 to determine when the ion exchanger 30 should be serviced. The determination of when the ion exchanger 30 should be serviced may be provided to the output device 150.

Service may include changing the ion exchanger 30 or ion exchanger components 32 of the ion exchanger 30, such as one or more filters or cartridges. Service can also include forcing extra coolant should through the ion exchanger at a higher flowrate to perform a deliberate de-ionization. A higher flowrate is in comparison to a steady-state flowrate that typically indicates the flowrate of the coolant through the coolant loop. The isolation resistance determining module 122 may cause the processor(s) 110 to automatically run the fuel cell in a predetermined maintenance operation specifically designed to force extra coolant at a higher flowrate through the ion exchanger 30 by properly actuating the pump 22 and the three-way valve 38.

Figure 5:
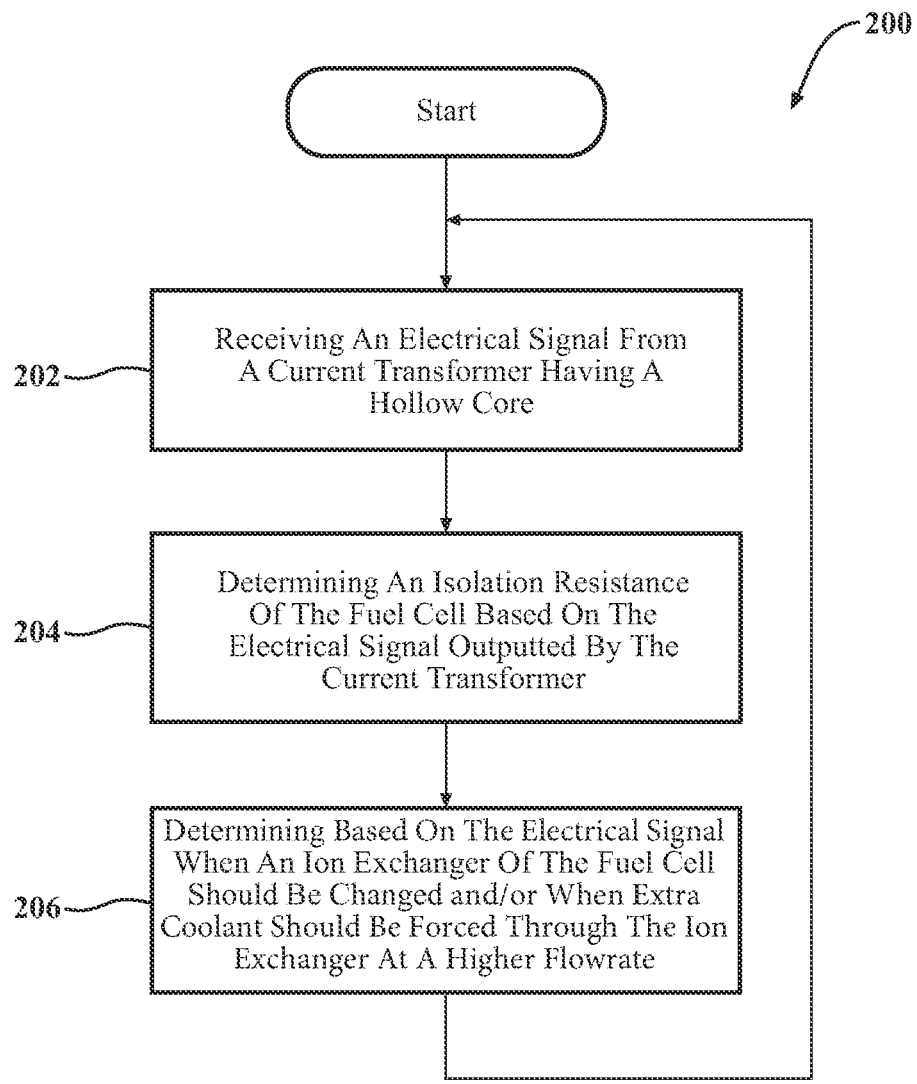
FIG. 5 illustrates a method for determining the isolation resistance of one or more fuel cells.

Referring to FIG. 5, a method 200 for determining the isolation resistance of a fuel cell or plurality of fuel cells is shown. The method 200 will be described from the viewpoint of the fuel cell system 10 of FIG. 1 and the isolation resistance determining system 100 of FIG. 4. However, it should be understood that this is just one example of implementing the method 200. While method 200 is discussed in combination with the isolation resistance determining system 100, it should be appreciated that the method 200 is not limited to being implemented within the isolation resistance determining system 100 but is instead one example of a system that may implement the method 200.

In step 202, the isolation resistance determining module 122 causes the processors(s) 110 to receive information from the current transformer 60 directly or indirectly by the transmitter 70 the receiver 140. As stated previously, the electrical signal 67 generated by the current transformer may be in the form of an analog or digital signal that can then be converted to data stored as the current transformer data 132.

In step 204, the isolation resistance determining module 122 causes the processors(s) 110 to determine an isolation resistance of the plurality of fuel cells based on the electrical signal outputted by the current transformer 60 and/otherwise stored as the current transformer data 132. As stated previously, the current transformer data 132 and/or the electrical signal 67 essentially represents the current differential of the current transmitted by the electrical lines that pass through the hollow core 62. Here, the isolation resistance determining module 122 may cause the processor(s) 110 to utilize the models or lookup tables 134 to convert the current differential measured by the current transformer 60 into an indirect measurement regarding the isolation resistance of the fuel cell 12.

In step 206, the isolation resistance determining module 122 causes the processors(s) 110 to determine when the ion exchanger 30 should be serviced. Service may include changing the ion exchanger 30 or change the ion exchanger components 32 of the ion exchanger 30, such as one or more filters or cartridges. Service can also include forcing extra coolant should through the ion exchanger at a higher flowrate to perform a deliberate de-ionization. A higher flowrate is in comparison to a steady-state flowrate that typically indicates the flowrate of the coolant through the coolant loop. The determination of when the ion exchanger 30 should be serviced may be provided to the output device 150.

From there, the method 200 may end or may return to step 202. It may be advantageous to have the method 200 return to step 202 and run continuously to continually monitor the isolation resistance of the fuel cell system 10 to determine when it is appropriate to service the ion exchanger 30. By so doing, the ion exchanger 30 will be serviced when it is necessary, saving both time and cost while also preventing damage to the fuel cell system 10.

It should be appreciated that any of the systems described in this specification can be configured in various arrangements with separate integrated circuits and/or chips. The circuits are connected via connection paths to provide for communicating signals between the separate circuits. Of course, while separate integrated circuits are discussed, the circuits may be integrated into a common integrated circuit board in various embodiments. Additionally, the integrated circuits may be combined into fewer integrated circuits or divided into more integrated circuits.

In another embodiment, the described methods and/or their equivalents may be implemented with computer-executable instructions. Thus, in one embodiment, a non-transitory computer-readable medium is configured with stored computer-executable instructions that, when executed by a machine (e.g., processor, computer, and so on), cause the machine (and/or associated components) to perform the method.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may be executed substantially concurrently, or the blocks may sometimes be executed in the reverse order, depending upon the functionality involved.

The systems, components, and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A combination of hardware and software can be a processing system with computer-usable program code that, when being loaded and executed, controls the processing system such that it carries out the methods described herein. The systems, components, and/or processes also can be embedded in a computer-readable storage, such as a computer program product or other data programs storage device, readable by a machine, tangibly embodying a program of instructions executable by the machine to perform methods and processes described herein. These elements can also be embedded in an application product that comprises all the features enabling the implementation of the methods described herein and, when loaded in a processing system, can carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Examples of such a computer-readable medium may include, but are not limited to, a floppy disk, a flexible disk, a hard disk, a magnetic tape, other magnetic medium, an ASIC, a graphics processing unit (GPU), a CD, other optical medium, a RAM, a ROM, a memory chip or card, a memory stick, and other media from which a computer, a processor or other electronic device can read. In the context of this document, a computer-readable storage medium may be any tangible medium that can contain or store a program for use by or in connection with an instruction execution system, apparatus, or device.

The following includes definitions of selected terms employed herein. The definitions include various examples and/or forms of components that fall within the scope of a term and may be used for various implementations. The examples are not intended to be limiting. Both singular and plural forms of terms may be within the definitions.

References to "one embodiment," "an embodiment," "one example," "an example," and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Module," as used herein, includes a computer or electrical hardware component(s), firmware, a non-transitory computer-readable medium that stores instructions, and/or combinations of these components configured to perform a function(s) or an action(s), and/or to cause a function or action from another logic, method, and/or system. Module may include a microprocessor controlled by an algorithm, a discrete logic (e.g., ASIC), an analog circuit, a digital circuit, a programmed logic device, a memory device including instructions that, when executed, perform an algorithm so on. In one or more embodiments, a module may include one or more CMOS gates, combinations of gates, or other circuit components. Where multiple modules are described, one or more embodiments may include incorporating the multiple modules into one physical module component. Similarly, where a single module is described, one or more embodiments distribute the single module between multiple physical components.

Additionally, module, as used herein, includes routines, programs, objects, components, data structures, and so on that perform tasks or implement data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an application-specific integrated circuit (ASIC), a hardware component of a system on a chip (SoC), as a programmable logic array (PLA), as a graphics processing unit (GPU), or as another suitable hardware component that is embedded with a defined configuration set (e.g., instructions) for performing the disclosed functions.

In one or more arrangements, one or more of the modules described herein can include artificial or computational intelligence elements, e.g., neural network, fuzzy logic, or other machine learning algorithms. Further, in one or more arrangements, one or more of the modules can be distributed among a plurality of the modules described herein.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A system comprising:
a current transformer having a hollow core;
a first set of load lines being located within the hollow core and electrically connected between an anode and a cathode of a first fuel cell and a first electrical load;
a second set of load lines being located within the hollow core and electrically connected between an anode and a cathode of a second fuel cell and a second electrical load;
a processor in communication with an electrical signal outputted by the current transformer; and
a memory in communication with the processor, the memory having an isolation resistance determining module including instructions that, when executed by the processor, cause the processor to:
determine an isolation resistance of the first and second fuel cells based on the electrical signal outputted by the current transformer, and
instruct a pump to force extra coolant through at least one ion exchanger of the first and second fuel cells at a higher flowrate based on the isolation resistance.

2. The system of claim 1, wherein the electrical signal outputted by the current transformer is proportional to a current passing through the hollow core.

3. The system of claim 2, wherein the current passing through the hollow core is a differential current indicating a difference between first currents between the anodes of the first and second fuel cells and the first and second electrical loads and second currents between the first and second electrical loads and the cathodes of the first and second fuel cells.

4. The system of claim 1, wherein the isolation resistance determining module further includes instructions that, when executed by the processor, cause the processor to determine, based on the electrical signal outputted by the current transformer,
when the at least one ion exchanger of the first and second of fuel cells should be changed.

5. The system of claim 3, wherein first and second of fuel cells are hydrogen fuel cells.

6. A method comprising steps of:
receiving an electrical signal from a current transformer having a hollow core, wherein a first set of load lines are located within the hollow core and electrically connected between an anode and a cathode of a first fuel cell and a first electrical load and a second set of load lines being located within the hollow core and electrically connected between an anode and a cathode of a second fuel cell and a second electrical load;

determining an isolation resistance of the first and second fuel cells based on the electrical signal outputted by the current transformer; and instructing a pump to force extra coolant through at least one ion exchanger of the first and second fuel cells at a higher flowrate based on the isolation resistance.

7. The method of claim 6, wherein the electrical signal is proportional to a current passing through the hollow core.

8. The method of claim 7, wherein the current passing through the hollow core is a differential current indicating a difference between first currents between the anodes of the first and second fuel cells and the first and second electrical loads and second currents between the first and second electrical loads and the cathodes of the first and second fuel cells.

9. The method of claim 8, further comprising the step of determining based on the electrical signal outputted by the current transformer when the at least one ion exchanger of the first and second fuel cells should be changed.

10. The method of claim 8, further comprising the steps of determining an electrical conductivity of a coolant of the first and second fuel cells based on the electrical signal outputted by the current transformer.

* * * * *